(12) United States Patent
DeDaran et al.

(10) Patent No.: US 6,717,301 B2
(45) Date of Patent: Apr. 6, 2004

(54) FILTERING AND INTERFERENCE SUPPRESSING DEVICE FOR AN ELECTRIC MOTOR

(75) Inventors: François DeDaran, Chatellerault (FR); Séverin Bruneau, Chatellerault (FR); Philippe Rouyer, Chatellerault (FR); Abdou Salembere, Chatellerault (FR)

(73) Assignee: Valeo Systemes d'Essuyage (FR)

( * ) Notice: Subject to any disclaimer, the term of this patent is extended or adjusted under 35 U.S.C. 154(b) by 0 days.

(21) Appl. No.: 10/239,983

(22) PCT Filed: Mar. 20, 2001

(86) PCT No.: PCT/FR01/00969
§ 371 (c)(1),
(2), (4) Date: Sep. 26, 2002

(87) PCT Pub. No.: WO01/76042
PCT Pub. Date: Oct. 11, 2001

(65) Prior Publication Data
US 2003/0048029 A1 Mar. 13, 2003

(30) Foreign Application Priority Data
Mar. 30, 2000 (FR) .............................................. 00 04022

(51) Int. Cl.⁷ .......................... H02H 7/08; H02K 11/00
(52) U.S. Cl. ...................... 310/68 R; 310/68 C; 310/72; 310/DIG. 6; 361/23
(58) Field of Search .............................. 310/220, 68 R, 310/DIG. 6, 72, 68 C; 361/26, 27, 30, 31, 33, 23

(56) References Cited

U.S. PATENT DOCUMENTS

| 4,329,605 A | | 5/1982 | Angi et al. ................ 310/68 R |
| 4,795,951 A | * | 1/1989 | Gaebel et al. ............... 318/293 |
| 5,420,553 A | | 5/1995 | Sakamoto et al. .......... 333/172 |
| 6,018,448 A | | 1/2000 | Anthony ....................... 361/56 |
| 6,055,141 A | * | 4/2000 | Dorschky et al. ............. 361/25 |
| 6,509,807 B1 | | 1/2003 | Anthony et al. ............... 333/12 |
| 6,594,128 B2 | | 7/2003 | Anthony ....................... 361/56 |

FOREIGN PATENT DOCUMENTS

| GB | 2217136 | 10/1989 | ............ H03H/7/01 |
| WO | WO/99/52210 | 10/1999 | ................. 310/248 |

* cited by examiner

*Primary Examiner*—Burton Mullins
(74) *Attorney, Agent, or Firm*—J. Gordon Lewis

(57) ABSTRACT

A device for filtering and interference suppression in an electric motor includes at least first powering brush for an armature commutator of the electric motor, a capacitor having one terminal electrically connected to a strip conductor electrically powering the first brush, and another terminal electrically connected to a ground strip conductor connected to the electric ground of the motor. The capacitor of the filtering and interference suppression device is non-inductive.

21 Claims, 4 Drawing Sheets

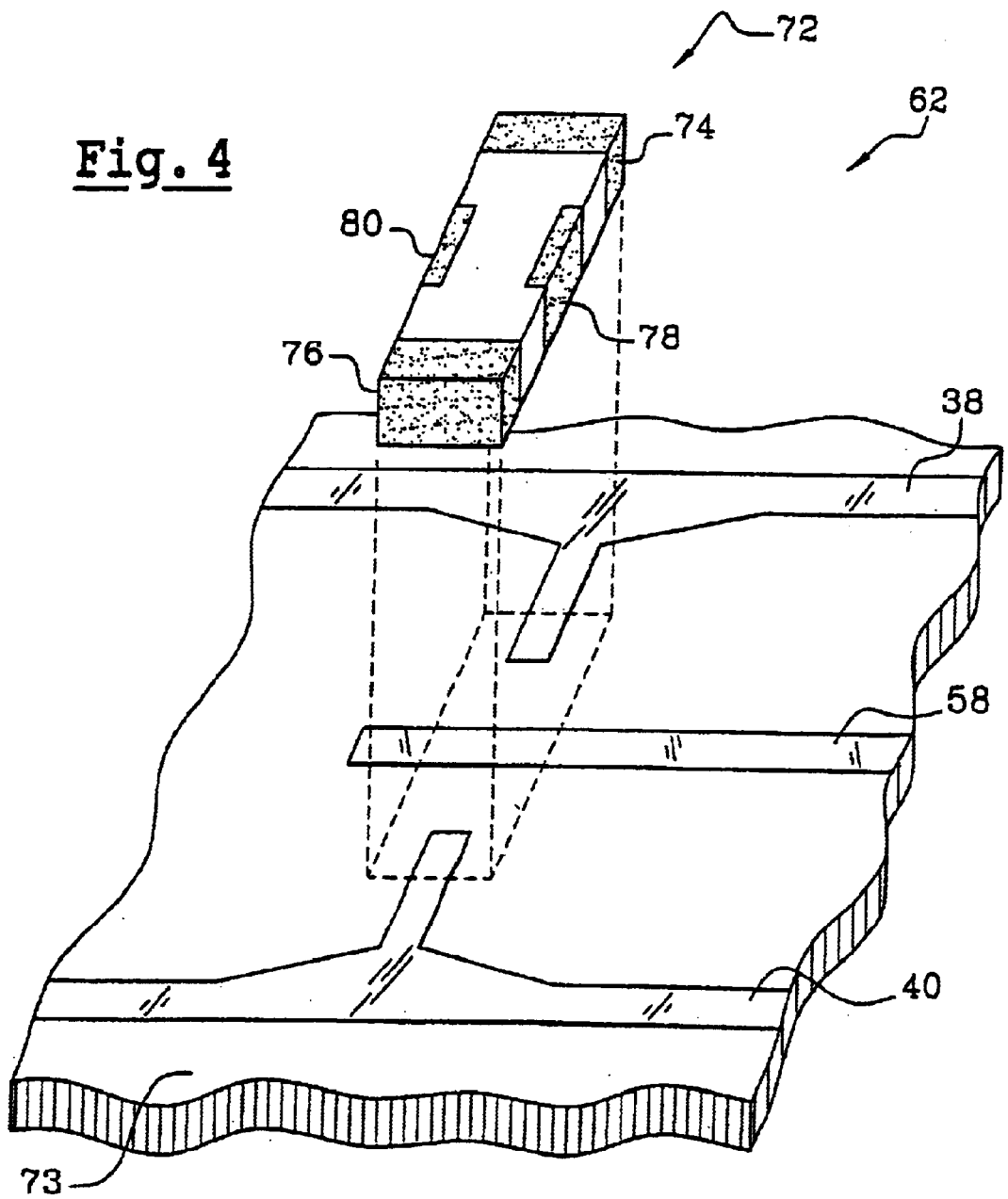

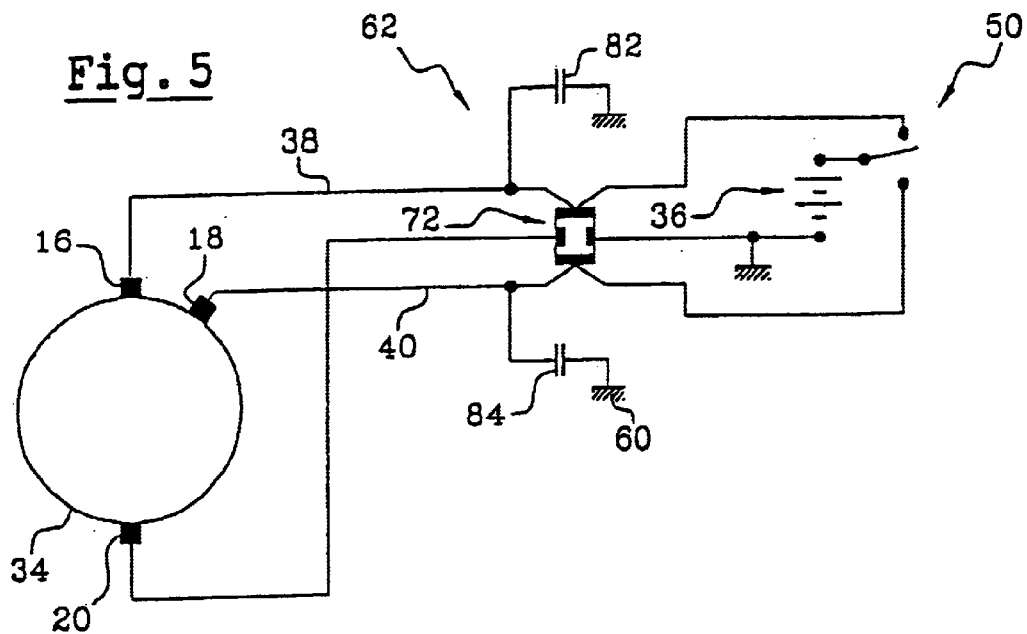
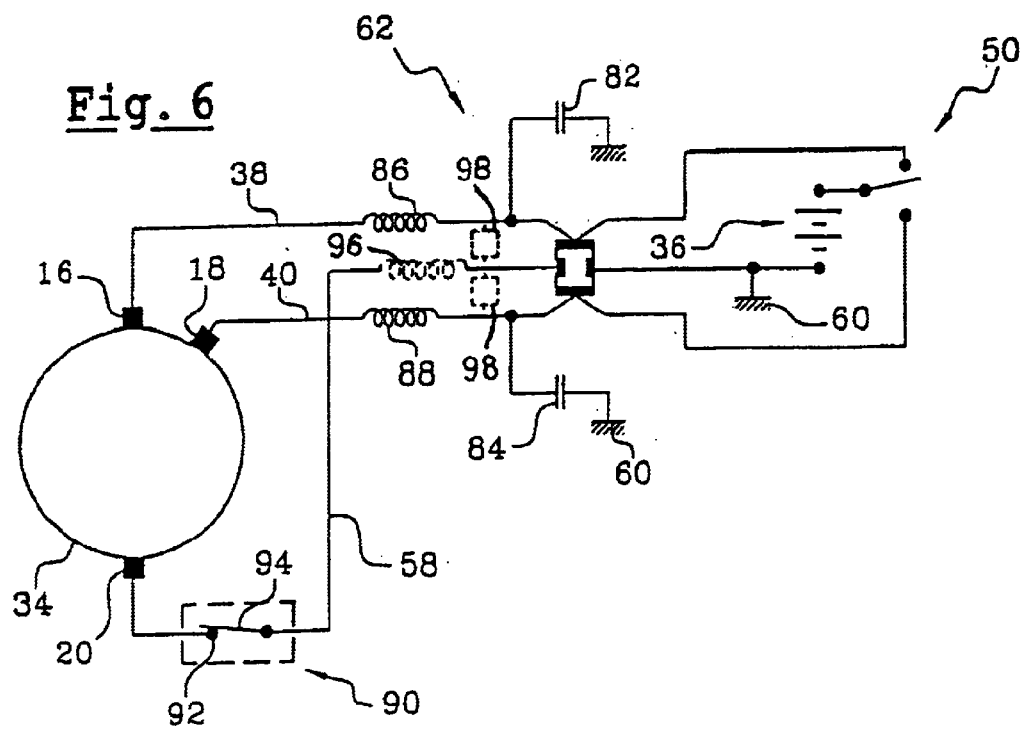

FILTERING AND INTERFERENCE SUPPRESSING DEVICE FOR AN ELECTRIC MOTOR

BACKGROUND

The invention concerns a filtering and interference suppression device for an electric motor.

More specifically the invention concerns a device for filtering and interference suppression, particularly of the broad-band, high-frequency type, for an electric motor supplied by voltage that could be as high as at least 60 V. Brush-and-commutator electric motors, particularly those that drive such equipment as windshield wipers or heating and ventilation equipment, produce interference over wide frequency bands. Such interference may disturb electronic equipment in its vicinity. In effect, it can, for example, cause the untimely activation of a switch controlled by an electronic system.

Developments in electronic equipment make it possible to produce more compact and higher performance electronic circuits, but they remain susceptible to interference particularly at high frequencies. To solve such problems, there are interference suppression devices that reduce or eliminate the harmful effects of such interference.

Such known devices consist primarily of filters composed of a capacitor, one terminal of which is connected to a strip conductor electrically powering a brush, and the other terminal of which is connected to the electrical ground of the motor, and of a coil or choke that is interposed between the corresponding brush and the capacitor terminal connected to the strip conductor that powers the brush. Generally, the coil suppresses high-frequency interference while the capacitor suppresses low-frequency interference.

Such devices make it possible to suppress interference produced in a frequency range that extends from 150 kHz to about 100 MHz. However, the use of electric motors more often requires that the influence of interference be suppressed over a frequency range of up to several GHz.

SUMMARY

To provide a solution to this problem, the invention proposes a filtering and interference suppression device for an electric motor comprising at least a first powering brush for an armature commutator of the electric motor, a capacitor, one terminal of which is electrically connected to a strip conductor that electrically powers the first brush powering the armature commutator of the electric motor, and the other terminal of which is electrically connected to a ground strip conductor connected to the electrical ground of the motor, characterized in that the capacitor of the filtering and interference suppression device is of the non-inductive type.

Thus, compared with filtering and interference suppression devices of the type known from the prior art, the filtering and interference suppression device according to the invention has improved performance with the same compact size. This makes it possible to retain a similar layout and the same motor volume.

According to other characteristics of the invention:

the device comprises at least a first and second powering brush for the armature commutator, each of which is connected to the electrical ground of the motor, with the interposition of a capacitor, one terminal of which is connected to a strip conductor electrically powering the corresponding brush, and the other terminal of which is connected to ground, wherein each capacitor is a capacitor of the non-inductive type;

the two filtering and interference suppression capacitors of the non-inductive type are made in the form of a double non-inductive capacitor;

each of the non-inductive capacitors is attached directly to a circuit board comprising strip conductors, which include at least one strip conductor powering the brush and one ground strip;

the circuit board is the brush-bearing board for the electric motor;

each filtering and interference suppression capacitor is of the SMC-type;

the electric terminals of each non-inductive capacitor are electrically connected and attached directly to the corresponding strip conductors;

each terminal is attached and electrically connected to the corresponding strip by soldering;

each terminal is attached and electrically connected to the corresponding strip by gluing with a conductive glue;

the device comprises at least one other capacitor interposed between the ground strip and one section of the power strip for at least one of the brushes powering the commutator located between the non-inductive capacitor and the corresponding brush;

at least one of the other capacitors is of the SMC-type;

the section of at least one of the power strips for one of the brushes powering the commutator, which is located between the non-inductive capacitor and the corresponding brush, comprises a series choke;

the device comprises a choke connected in series in the ground strip between one ground terminal of the non-inductive capacitor and the brush;

at least one of the chokes is of the high-frequency type;

at least one of the chokes is coiled, and in that it comprises at least one space that separates two juxtaposed turns of the coil;

at least one of the chokes is of the SMC-type;

it comprises a thermal protector located on the ground strip;

the device comprises at least one peak limiter mounted in parallel with the noninductive capacitor, between the ground strip and one of the conducting strips;

at least one of the peak limiters is of the SMC-type.

BRIEF DESCRIPTION OF THE DRAWINGS

Other characteristics and advantages of the invention will be disclosed upon reading the following detailed description, for the better understanding of which we shall refer to the attached drawings, where:

FIG. 4 is an exploded perspective view of a non-inductive capacitor before it is mounted on the brush-bearing board of the electric motor according to the present invention; and FIGS. 5 and 6 are schematic illustrations similar to those in FIG. 3 according to two variants of the invention.

DETAILED DESCRIPTION

Figure 1:
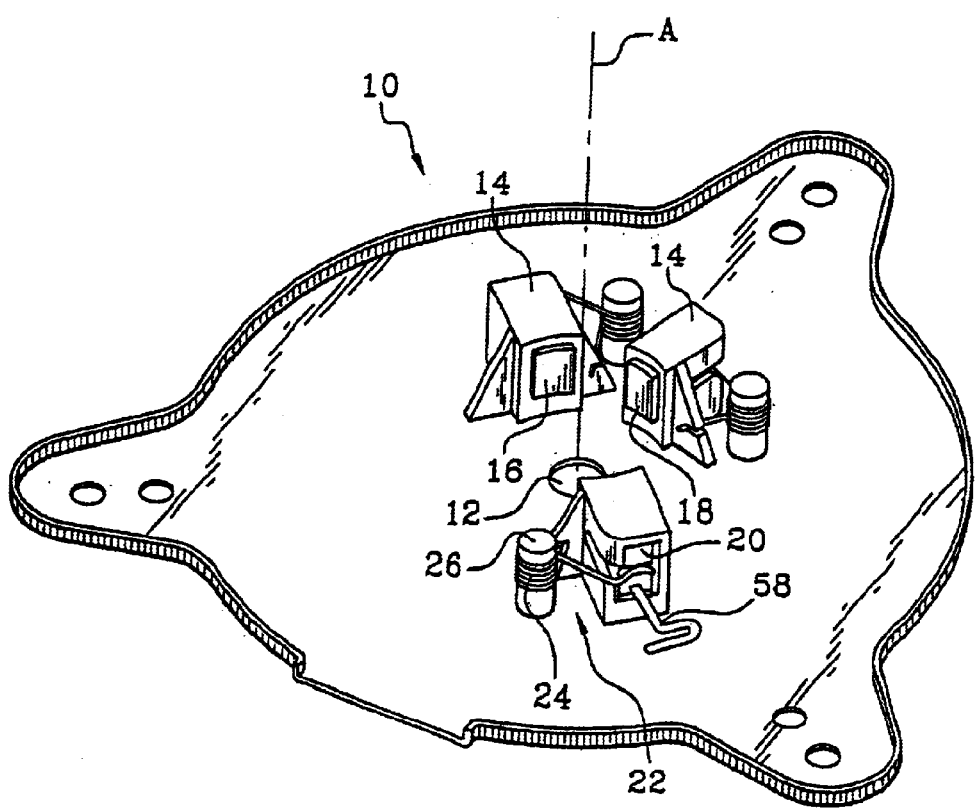
FIG. 1 is a perspective view of a brush-bearing board at the axial end of an electric motor bearing the powering brushes for an armature commutator.

FIG. 1 illustrates brush-bearing board or end-plate 10, designed to constitute the cowling or axial closing bearing support of an electric motor, the other components of which, specifically the frame or stator jacket and armature rotor, are not illustrated. Brush-bearing board 10 comprises central circular opening 12 for shaft A, which receives a bearing, not shown, that allows one free end of the armature rotor to be guided in rotation.

Three housings 14 here each receive one brush 16, 18, and 20. Each housing 14 fits together with each brush 16, 18, or 20 that it receives, and its opposing inner and outer radial ends extend radially from shaft A.

In a known way, each brush 16, 18, and 20 is constantly elastically pressed radially inwardly by means of a brush spring 22, of which a helicoidal element 24 is mounted by being axially threaded onto an attachment rod 26. Each brush 16, 18, and 20 is electrically connected to an electric strip conductor 38, 40, and 58, respectively (only strip conductor 58 shown in FIG. 1).

The electric motor 34 of the type described above is schematically illustrated in FIG. 2. The electric motor 34 is a two-speed DC motor indicating the first brush 16 with a positive polarity for the slow speed, and the second brush 18 with a positive polarity for the fast speed, and brush 20 with negative polarity, which electrically supplies the armature commutator (not shown) of the motor 34.

Brushes 16, 18, and 20 are electrically supplied by power source 36, such as a vehicle battery. Electric power strip conductors 38 and 40 provide power to first and second brushes 16 and 18, respectively, from the positive terminal of the power source 36.

Electric switch 50 is of the single-pole type and has two extreme positions and one central position, which corresponds to the off position for motor 34. The switch 50 comprises moving contact 52 and two fixed contacts 54 and 56, connected to the ends of strip conductors 38 and 40, respectively. The two extreme positions of the switch 50 thereby correspond to positions in which moving contact 52 is in contact with fixed contact 54 or 56 in order to supply power to first brush 16 for slow speed or to second brush 18 for fast speed, respectively.

Figure 2:
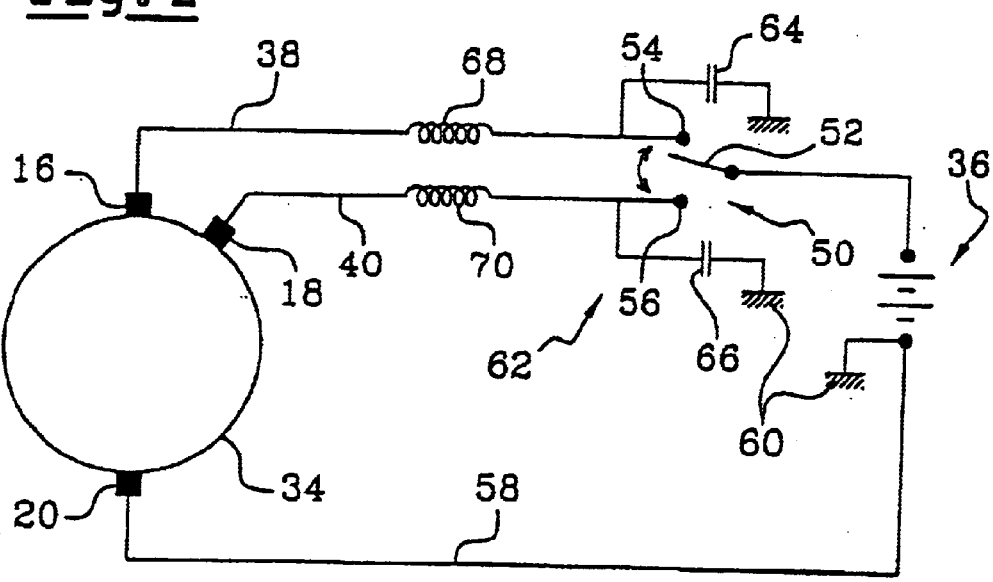
FIG. 2 schematically represents a control circuit of an electric motor comprising a filtering and interference suppression device according to the state of the art.

Strip conductor 58 electrically connects the brush 20 with negative polarity to the negative terminal of the power source 36. Strip conductor 58, shown here in FIG. 2, is connected to electrical ground 60 of the electric motor 34. Strip conductor 58 is therefore known as a ground strip conductor 58.

The connection of strip conductor 58 to electrical ground 60 may be made upstream or downstream from non-inductive capacitor 72, relative to power source 36.

According to the state of the art, a filtering and interference suppression device 62 consists of two pairs, each of which is respectively comprised of one capacitor 64, 66 and one choke or coil 68, 70, and each of which is respectively associated with the power conducting strips for the first and second brushes 16, 18. Capacitors 64 and 66 are interposed between the electrical ground 60 of the motor 34 and the power strips 38 and 40, respectively. Self choke 68 and 70 are mounted in series on the strip conductors 38 and 40 between the brushes 16 and 18 and the terminals of capacitors 64 and 68, which are connected to the strip conductors 38 and 40, respectively.

Such a filtering and interference suppression device 62 makes it possible to suppress the generation of interference only within a frequency range extending from 150 kHz to about 100 MHz, as a function of the performance and characteristics of the individual components.

The invention makes it possible to extend that frequency range to up to several GHz. To do so, capacitors 64 and 66 and chokes 68 and 70 are replaced by non-inductive double capacitor 72. Such a non-inductive capacitor is fabricated, for example, by the Syfer company and sold under product number 1410J05000404MXBE03.

Figure 3:
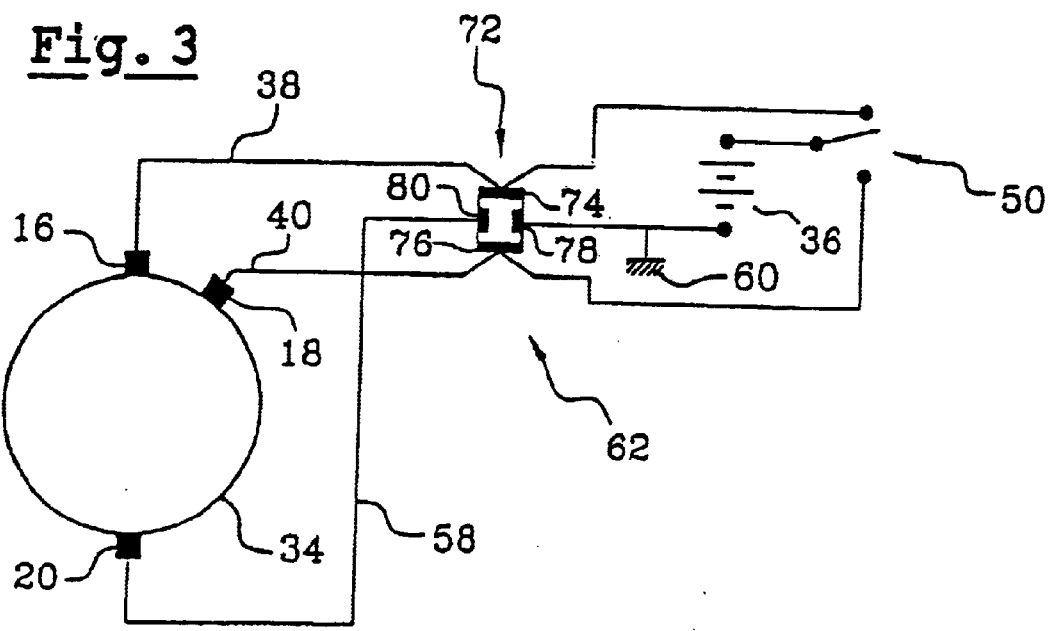
FIG. 3 schematically represents a filtering and interference suppression device for an electric motor realized according to the invention.

FIG. 3 schematically illustrates the control circuit of electric motor 34 according to the invention.

Non-inductive capacitor 72 includes four contact terminals in order to form a symmetrical component, two of which terminals 74 and 76 are connected to power strip conductors 38 and 40, respectively, and the other two 78 and 80, referred to as ground, are connected to electrical ground 60. The two ground terminals 78 and 80 may advantageously be joined to form a single ground terminal.

Non-inductive capacitor 72 is of the SMC-type, in other words, it is a surface-mounted component. It does not have electric connection tabs; its contact terminals 74 to 80 are electrically connected and directly attached to the corresponding strip conductors.

FIG. 4 illustrates such a capacitor 72 before it is mounted on the strip conductors of a circuit board 73. Circuit board 73 advantageously is a brush-bearing plate or board 10 of electric motor 34. Strip conductors 38, 40, and 58 are silk-screened or cut-out and applied to the brush-bearing plate 10. When assembling the non-inductive capacitor 72, terminals 74, 76, 78, 80 are attached and electrically connected to corresponding strip conductors 38, 40, or 58 by a process such as bonding (soldering and brasing), crimping, clipping, or gluing by means of a conductive glue.

Non-inductive capacitor 72 thus makes it possible to reduce the number of components that comprise filtering and interference suppression device 62, but it also improves its performance.

Thus, for example, for electric motor 34 that drives the windshield wipers of an automobile vehicle with voltage that could be as high as at least 60 V, it would be advantageous to use non-inductive capacitor 72 with a capacitance of 1 $\mu$F to suppress the production of interference in a frequency range of 150 kHz to a few GHz.

A first variant of the invention, according to FIG. 5, proposes the interposition of two capacitors 82 and 84 between the electrical ground 60 of the motor 34 and the sections of strip conductors 38 and 40 located between brushes 16 and 18 and non-inductive capacitor 72, respectively.

Thus, the use of non-inductive capacitor 72, with a capacitance of 100 nF, with two capacitors 82 and 84, each with a capacitance of 1 $\mu$F, makes it possible to obtain results similar to the preceding assembly.

FIG. 6 presents a second variant which makes it possible to increase the precision of the results obtained by filtering and interference suppression device 62 by respectively adding a choke 86, 88 in series with the section of conductor strip 38, 40 powering the brush 16, 20 that powers the commutator located between the non-inductive capacitor 72 and the corresponding brush 16, 18.

Advantageously, a thermal protection device 90 is mounted on the ground strip 58, which makes it possible to stop the motor 34 when the temperature to which it is subjected exceeds a temperature limit that would risk damaging the motor 34.

Thermal protection device 90 consists, for example, of a bimetallic strip composed of first fixed strip 92 and second articulated strip 94. When the temperature of the bimetallic strip is below the temperature limit, the two strips 92 and 94 are in contact, as shown in FIG. 6. When the temperature of the bimetallic strip is higher than the temperature limit, the expansion of strip 94 causes it to rotate about its articulation point and separate from the strip 92, so as to break the circuit and interrupt power to the brush 20.

According to another variant, not shown, ground strip 58 is not directly connected to the electrical ground 60 of the electric motor 34. In this case, an inductive or non-inductive capacitor connects the ground strip 58 to the electrical ground 60 of the motor 34.

A choke 96 (shown in dashed line in FIG. 6) may also be interposed in series on the ground strip 58, between the ground terminal 78, 80 of the non-inductive capacitor 72 and the brush 20, thereby permitting further improvement of the performance of the filtering and interference suppression device 62. The choke may be of the broad-band type. It may be coiled and include a space between each juxtaposed turn; such a choke is known as a choke with unjoined turns.

Peak-limiting devices 98 (shown with dashed lines in FIG. 6) make it possible to avoid overloads at the brushes 16 and 18, each device 98 of which may be advantageously mounted in parallel with the capacitor 72 between the ground strip 58 and one of the strip conductors 38 and 40. These peak-limiting devices may consist of varistors or such silicon components as Zener diodes. Peak-limiting devices may be attached to the support by mounting tabs or may be of the surface-mounted SMC-type.

All of the components of the filtering and interference suppression device 62 according to the invention and, in particular, capacitors 82, 84, chokes 86, 88, and the thermal protection devices may advantageously be replaced by surface-mounted SMC-type components.

What is claimed is:

1. A filtering and interference suppression device for an electric motor comprising;

a first powering brush for an armature commutator of the electric motor;

a non-inductive capacitor, having a first terminal electrically connected to a strip conductor that electrically powers the first powering brush, and a second terminal electrically connected to a ground strip conductor, connected, in turn, to an electrical ground of the electric motor, wherein the non-inductive capacitor is directly attached to a circuit board including the strip conductors; and a choke connected in series on the ground strip between a ground terminal of the non-inductive capacitor and the first powering brush.

2. The filtering and interference suppression device for an electric motor according to claim 1, further comprising:

a second powering brush for the armature commutator; and a second non-inductive capacitor, one terminal of which is connected to a strip conductor electrically powering the second powering brush, and the other terminal of which is connected to the electrical ground.

3. The filtering and interference suppression device according to claim 2, wherein the non-inductive capacitor and the second non-inductive capacitor are made in the form of a double non-inductive capacitor.

4. The filtering and interference suppression device according to claim 2, further comprising:

a peak limiter connected in parallel with the non-inductive capacitor, between the ground strip conductor and the strip conductor electrically powering the first powering brush.

5. The filtering and interference suppression device according to claim 4, further comprising:

a second peak limiter connected in parallel with the second non-inductive capacitor, between the ground strip conductor and the strip conductor electrically powering the second powering brush.

6. The filtering and interference suppression device according to claim 1, wherein the circuit board is the brush-bearing board of the electric motor.

7. The filtering and interference suppression device according to claim 1, wherein the non-inductive capacitor is a surface-mounted component.

8. The filtering and interference suppression device according to claim 1, wherein each of the electric terminals of the non-inductive capacitor are electrically connected and directly attached to the corresponding strip conductors.

9. The filtering and interference suppression device according to claim 8, wherein each of the electric terminals is attached and is electrically connected to the corresponding strip by soldering.

10. The filtering and interference suppression device according to claim 8, wherein each of the electric terminals is attached and is electrically connected to the corresponding strip by a conductive glue.

11. The filtering and interference suppression device according to claim 1, further comprising:

at least one other capacitor interposed between the ground strip and the power strip for the first powering brush, wherein a terminal of the at least one other capacitor is located between the non-inductive capacitor and the first powering brush.

12. The filtering and interference suppression device according to claim 11, wherein the at least one other capacitor is a surface-mounted component.

13. The filtering and interference suppression device according to claim 1, further comprising:

a second choke connected in series between the non-inductive capacitor and the first powering brush.

14. The filtering and interference suppression device according to claim 13, wherein at least one of the choke and the second choke is of the high frequency type.

15. The filtering and interference suppression device according to claim 13, wherein at least one of the choke and the second choke is coiled and comprises at least one space that separates two juxtaposed turns.

16. The filtering and interference suppression device according to claim 13, wherein at least one of the choke and the second choke is a surface-mounted component.

17. A filtering and interference suppression device for an electric motor, comprising:

a first powering brush for an armature commutator of the electric motor, a non-inductive capacitor having a first terminal electrically connected to a strip conductor that electrically powers the first powering brush and a second terminal electrically connected to a ground strip conductor, the ground strip conductor connected to an electrical ground of the electric motor; and a thermal protector located on the ground strip conductor.

18. The filtering and interference suppression device according to claim 17, further comprising:

a peak limiter connected in parallel with the non-inductive capacitor, between the ground strip conductor and the strip conductor electrically powering the first powering brush.

19. A filtering and interference suppression device for an electric motor, comprising:

a first powering brush for an armature commutator of the electric motor;

a non-inductive capacitor having a first terminal electrically connected to a strip conductor that electrically powers the first powering brush, and a second terminal electrically connected to a ground strip conductor, the ground strip conductor connected to an electrical ground of the electric motor;

at least one other capacitor interposed between the ground strip and the power strip for the first powering brush; and at least one peak limiter connected in parallel with the non-inductive capacitor, between the ground strip conductor and the strip conductor.

20. The filtering and interference suppression device according to claim 19, wherein the at least one peak limiter is a surface-mounted component.

21. The filtering and interference suppression device according to claim 19, further comprising:

a thermal protector located on the ground strip conductor.

* * * * *